(12) United States Patent
Tomoda

(10) Patent No.: US 7,049,207 B2
(45) Date of Patent: May 23, 2006

(54) ISOLATING METHOD AND TRANSFERRING METHOD FOR SEMICONDUCTOR DEVICES

(75) Inventor: Katsuhiro Tomoda, Kanagawa (JP)

(73) Assignee: Sony Corporation, Tokyo (JP)

( * ) Notice: Subject to any disclaimer, the term of this patent is extended or adjusted under 35 U.S.C. 154(b) by 389 days.

(21) Appl. No.: 10/430,632

(22) Filed: May 6, 2003

(65) Prior Publication Data

US 2004/0023493 A1 Feb. 5, 2004

(30) Foreign Application Priority Data

May 20, 2002 (JP) .............. P2002-145387

(51) Int. Cl.
*H01L 21/30* (2006.01)
*H01L 21/46* (2006.01)
(52) U.S. Cl. ............ 438/455; 438/456; 438/457; 257/79
(58) Field of Classification Search ........... 257/79–85, 257/96; 438/455–459
See application file for complete search history.

(56) References Cited

U.S. PATENT DOCUMENTS

| 5,985,687 A | * | 11/1999 | Bowers et al. ............ 438/46 |
| 6,013,534 A | * | 1/2000 | Mountain ................ 438/15 |
| 6,222,118 B1 | * | 4/2001 | Matsushita et al. ....... 136/256 |
| 6,403,985 B1 | * | 6/2002 | Fan et al. ................ 257/88 |
| 6,589,811 B1 | * | 7/2003 | Sayyah ................. 438/106 |
| 6,849,878 B1 | * | 2/2005 | Bader et al. ............ 257/103 |
| 2003/0092212 A1 | * | 5/2003 | Buchanan et al. ......... 438/48 |

FOREIGN PATENT DOCUMENTS

DE      10042947 A1 * 3/2002

* cited by examiner

*Primary Examiner*—Duy-Vu N. Deo
(74) *Attorney, Agent, or Firm*—Bell, Boyd & Lloyd LLC

(57) ABSTRACT

A method of isolating semiconductor devices by wet etching of a semiconductor laminate structure formed on a substrate includes providing an etching stop layer having at least two layers between the substrate and the semiconductor laminate structure. The semiconductor laminate structure is etched to isolate the semiconductor devices, the substrate is then etched away, followed by sequentially etching away of the etching stop layer.

13 Claims, 10 Drawing Sheets

ISOLATING METHOD AND TRANSFERRING METHOD FOR SEMICONDUCTOR DEVICES

BACKGROUND OF THE INVENTION

The present invention relates to an isolating method and a transferring method for semiconductor devices, and particularly to an isolating method and a transferring method for semiconductor devices which are suitable for application to the manufacture of miniaturized semiconductor devices.

In recent years, a variety of photoelectric devices using a semiconductor material have been developed and put to practical use, and among them are, for example, GaAs-based devices. In the case of forming, for example, a light-emitting diode (hereinafter referred to as LED) array using these GaAs-based devices as photoelectric devices, it is necessary to remove a GaAs substrate in order to provide optical access to the devices.

Here, the conventional method of forming an LED array by use of the GaAs-based devices as photoelectric devices will be described. First, as shown in FIG. 20, a laminate structure 102 for constituting, for example, AlGaInP-based LEDs is provided on a GaAs substrate 101. Specifically, as shown in FIG. 21, an n-type GaAs contact layer 103, an n-type AlGaInP clad layer 104, an AlGaInP active layer 105, a p-type AlGaInP clad layer, and a p-type GaAs contact layer 107 are sequentially grown on the GaAs substrate 101 by, for example, the metallo-organic chemical vapor deposition (MOCVD) method.

Next, as shown in FIG. 22, wet etching of the laminate structure 102 formed on the GaAs substrate 101 is conducted from the face side, i.e., from the side opposite to the side of the GaAs substrate 101, to thereby isolate LED devices. Specifically, first, selective etching of only the p-type GaAs contact layer 107 is conducted. Next, selective etching of AlGaInP, i.e., selective etching of the p-type AlGaInP clad layer 106, the AlGaInP active layer 105, and the n-type AlGaInP clad layer 104 is conducted. Subsequently, selective etching of the n-type GaAs contact layer 103 is conducted, to isolate the LED devices 108 as shown in FIG. 23.

Next, an adhesive layer 109 is provided on a transfer substrate 110, for example, a sapphire substrate or the like by use of an adhesive, and the GaAs substrate 101 is adhered to the transfer substrate 110 so that the adhesive layer 109 and the isolated LED devices 108 face each other as shown in FIG. 24. Then, as shown in FIG. 25, the GaAs substrate 101 is subjected to lapping and wet etching, to remove the GaAs substrate 101, thereby completing the transfer of the LED devices 108 onto the transfer substrate 110 and producing an LED array 111.

However, a thickness of generally about 100 μm of the GaAs substrate 101 is removed by the wet etching, and, therefore, the conventional method as above-mentioned has the problem that the period of time for which the LED devices 108 are exposed to the etching solution is prolonged due to unevenness of etching in plane. Namely, in the case of the conventional method, the portions where the etching has proceeded faster are exposed to the etching solution until the completion of the etching of the portions where the GaAs substrate 101 is difficultly removed due to slow progress of the etching. Therefore, the n-type contact layer 103 is partially etched, so that the LED devices 108 with a uniform surface condition are not formed, and, further, the etched condition is dispersed on the basis of each LED device 108, so that a uniform LED array 111 cannot be produced. Besides, as shown in FIG. 26, the etching solution for the GaAs substrate 101 consisting, for example, of a mixed solution of aqueous ammonia and an aqueous hydrogen peroxide solution would permeate through the interface between the LED devices 108 and the adhesive layer 109, resulting in damage to the AlGaInP active layer 105 and/or the p-type GaAs contact layer 107.

As a method of solving this problem, there has been proposed a method of providing an etching stop layer 112 consisting of AlGaInP between the GaAs substrate 101 and the n-type GaAs contact layer 103, as shown in FIG. 27. However, since the n-type GaAs contact layer 103 is a thin layer, in the case where the n-type GaAs contact layer 103 has defects or the like, there arises the problem that the etching solution permeates through the defects in the n-type GaAs contact layer 103 at the time of etching the p-type AlGaInP clad layer 106, the AlGaInP active layer 105 and the n-type AlGaInP clad layer 104, resulting in that the etching stop layer 112 consisting of AlGaInP would be etched. In this instance, at the time of etching the GaAs substrate 101 from the back side, the etching solution permeates to the device side through the etched portions of the etching stop layer 112, giving bad influences such as erosion of the device component portions.

In addition, in the case where the etching stop layer 112 consists, for example, of AlGaAs, there is the problem that it is difficult to obtain a clean and uniform surface upon etching of the GaAs substrate 101, due to the adhesion of reaction products onto the surface of the etching stop layer 112 after completion of the etching of the GaAs substrate 101, oxidation of AlGaAs, and the like phenomena. These problems become more conspicuous as the LED devices 108 are more miniaturized, which is one of the factors hampering the miniaturization of the LED devices 108.

SUMMARY OF THE INVENTION

The present invention has been made in consideration of the above circumstances. Accordingly, it is an object of the present invention to provide a method of isolating semiconductor devices for manufacturing semiconductor devices with uniform and good quality without giving damage to the semiconductor devices even where the semiconductor devices are miniaturized, and a method of transferring semiconductor devices which uses the method of isolating semiconductor devices.

In order to attain the above object, according to one aspect of the present invention, there is provided a method of isolating semiconductor devices by wet etching of a semiconductor laminate structure formed on a substrate, wherein the method includes the steps of: intermediately providing an etching stop layer including at least two layers between the substrate and the semiconductor laminate structure; and etching the semiconductor laminate structure so as thereby to isolate the semiconductor devices, thereafter etching away the substrate, and sequentially etching away the etching stop layer including at least two layers.

In order to attain the above object, according to another aspect of the present invention, there is provided a method of isolating semiconductor devices by wet etching of a semiconductor laminate structure formed on a substrate, wherein the method includes the steps of: intermediately providing an etching stop layer including at least two layers between the substrate and the semiconductor laminate structure; and etching away the substrate, thereafter sequentially etching away the etching stop layer including at least two layers, and etching the semiconductor laminate structure so as thereby to isolate the semiconductor devices.

In order to attain the above object, according to a further aspect of the present invention, there is provided a method of transferring semiconductor devices by isolating the semiconductor devices through wet etching of a semiconductor laminate structure formed on a substrate, wherein the method includes the steps of: intermediately providing an etching stop layer including at least two layers between the substrate and the semiconductor laminate structure; and etching the semiconductor laminate structure so as thereby to isolate the semiconductor devices, adhering the substrate to a transfer substrate with the semiconductor laminate structure therebetween, thereafter etching away the substrate, and sequentially etching away the etching stop layer including at least two layers.

In order to attain the above object, according to a still another aspect of the present invention, there is provided a method of transferring semiconductor devices by isolating the semiconductor devices through wet etching of a semiconductor laminate structure formed on a substrate, wherein the method includes the steps of: intermediately providing an etching stop layer including at least two layers between the substrate and the semiconductor laminate structure; and adhering the substrate to a transfer substrate with the semiconductor laminate structure therebetween, etching away the substrate, thereafter sequentially etching away the etching stop layer including at least two layers, and etching the semiconductor laminate structure so as thereby to isolate the semiconductor devices.

In the method of isolating semiconductor devices and the method of transferring semiconductor devices according to the present invention as above-mentioned, the etching stop layer including at least two layers is intermediately provided between the substrate and the semiconductor laminate structure, the semiconductor laminate structure formed on the substrate is wet-etched by use of the etching stop layer to thereby isolate, and transfer, the semiconductor devices.

By this, in the method of isolating semiconductor devices and the method of transferring semiconductor devices according to the present invention, all the above-mentioned removal (etching-away) steps are steps of perfect selective etching. Namely, according to the present invention, the above-mentioned removal (etching-away) steps reside in perfect selective etching both in the case of wet etching from the face side of the substrate and in the case of wet etching from the back side of the substrate.

Therefore, only a predetermined layer is securely etched away in each of the steps, so that highly selective etching can be achieved, resulting in that the problem that the etching solution exudes to the semiconductor device side in the steps of removing the substrate and the etching stop layer to erode the device portions can be prevented from occurring. In addition, it is possible to achieve device isolation etching which is uniform in plane, so that the shape of each semiconductor device can be made uniform, resulting in that a semiconductor device array with uniform characteristics can be obtained.

Namely, in the method of isolating semiconductor devices and the method of transferring semiconductor devices according to the present invention, such troubles as erosion of other layers than the layer being etched can be prevented from occurring, and only the desired layer can be removed uniformly and securely without producing bad influences on other layers. As a result, semiconductor devices with uniform characteristics can be obtained.

Therefore, according to the present invention, it is possible to provide a semiconductor device having uniform and good quality, without causing damage to the semiconductor device, even where the semiconductor device is miniaturized.

Additional features and advantages of the present invention are described in, and will be apparent from, the following Detailed Description of the Invention and the figures.

DESCRIPTION OF THE PREFERRED EMBODIMENTS

Figure 1:
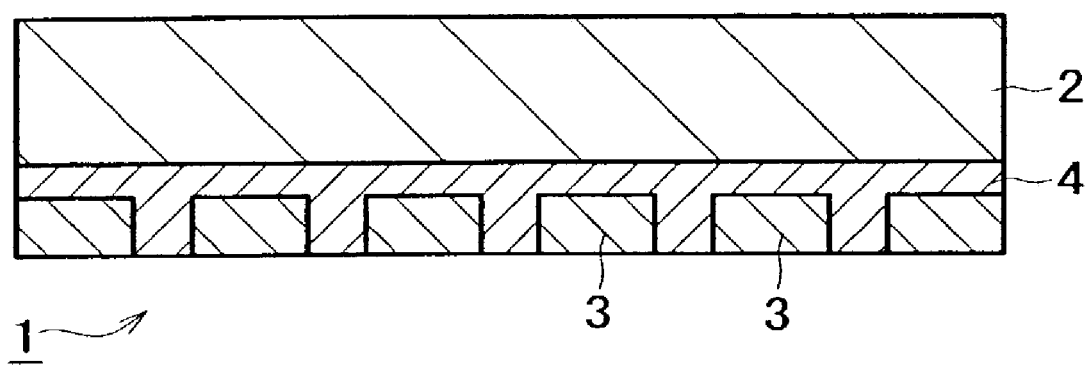
FIG. 1 is a sectional view showing one example of the constitution of an LED array manufactured by application of the present invention.

Now, the method of isolating semiconductor devices and the method of transferring semiconductor devices according to the present invention will be described in detail below, referring to the drawings. In the drawings, for ease of understanding, contraction scales different from the actual contraction scale may be used. The invention is not limited to the following description, and modifications can be appropriately made within the scope of not departing from the gist of the present invention.

Figure 2:
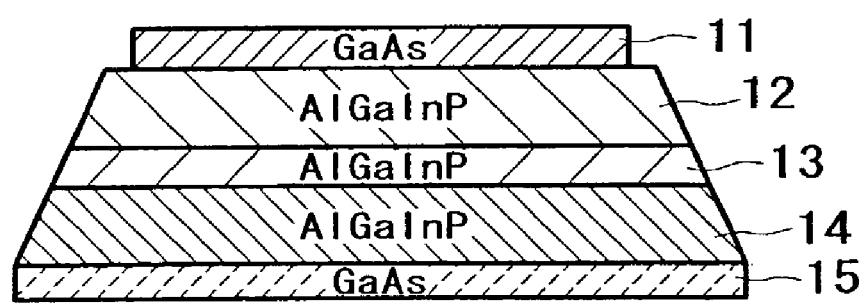
FIG. 2 is a sectional view showing one example of the constitution of an LED device produced by application of the present invention.

FIG. 1 is a sectional view showing a micro LED array produced by application of the present invention. The micro LED array 1 (hereinafter referred to simply as LED array 1) has a structure in which micro LED devices 3 (hereinafter referred to simply as LED devices 3) having undergone device isolation are adhered to a transfer substrate 2 by an adhesive layer 4 constituted of an adhesive. Here, each of the LED devices 3 has a structure in which, as shown in FIG. 2, a p-type contact layer 11, a p-type clad layer 12, an active layer 13, an n-type clad layer 14, and an n-type contact layer 15 are sequentially laminated in this order from the transfer substrate side. Here, the p-type contact layer 11 is formed of GaAs, the p-type clad layer 12 is formed of AlGaInP, the active layer 13 is formed of AlGaInP, the n-type clad layer 14 is formed of AlGaInP, and the n-type contact layer 15 is formed of GaAs.

In the LED device 3 constituted as above, n-type contact can be made from the back side of the LED after the removal of the GaAs substrate which will be described later. Therefore, it is unnecessary to provide a projected portion projected in the plane direction, i.e., a contact portion, in the n-type contact layer for the purpose of making the n-type contact, and it is unnecessary to provide both p- and n-type contact wirings on the face side, so that it is possible to enlarge the process margin and to contrive miniaturization of the LED.

In addition, the LED devices 3 have good quality because the surface of the n-type contact layer 15 is uniform and clean. Then, the LED devices 3 thus formed are arrayed uniformly, to constitute the LED array 1.

Figure 3:
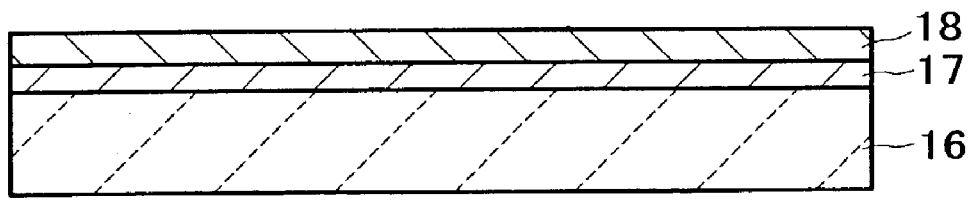
FIG. 3 is a sectional view for illustrating a method of transferring semiconductor devices according to the present invention, showing the condition where a first etching stop layer and a second etching stop layer have been formed on a GaAs substrate.

Such a micro LED array 1 as above-mentioned can be manufactured as follows. First, as shown in FIG. 3, a first etching stop layer 17 is formed, for example, of AlGaInP on a GaAs substrate 16, and a second etching stop layer 18 is formed, for example, of AlGaAs on the first etching stop layer 17.

Here, the first etching stop layer 17 is formed of a material which has a high etching selectivity ratio relative to the GaAs substrate 16. With the first etching stop layer 17 formed of such a material as this, it is possible to securely achieve selective etching of the GaAs substrate 16 as will be described later. Among such materials, preferred is a material with which it is possible to prevent adhesion of reaction products onto the surface of the etching stop layer 17 after completion of the wet etching conducted for removing the GaAs substrate 16 as will be described later, and to obtain a clean and uniform etched finished surface after the etching of the GaAs substrate 16. As such a material as this, there can be used a material which has a composition represented by $(Al_xGa_{1-x})_{0.51}In_{0.49}P$ ($0 \leq x \leq 1$), for example.

In addition, the second etching stop layer 18 is formed of a material which has a high etching selectivity ratio relative to the n-type contact layer 15. With the second etching stop layer 18 formed of such a material as this, it is possible to securely achieve selective etching of the n-type contact layer 15 as will be described later. Among such materials, preferred is a material which has a high etching selectivity ratio relative to the p-type clad layer 12, the active layer 13 and the n-type clad layer 14 in the steps of wet etching of these layers as will be described later. As such a material as this, there can be used a material having a composition represented by AlxGa1−xAs (0<x≦1), for example.

Besides, the film thicknesses of the first etching stop layer 17 and the second etching stop layer 18 are preferably in the range of from 0.1 to 2 μm. Where the film hicknesses of the first etching stop layer 17 and the second etching stop layer 18 are too small, it may be impossible for these layers to fully display the function as the etching stop layer. On the other hand, where the film thicknesses of the first etching stop layer 17 and the second etching stop layer 18 are too large, unevenness of etching may be generated at the time of the etching of the etching stop layer which will be described later, and it may be impossible to achieve uniform etching.

Therefore, with the film thicknesses of the first etching stop layer 17 and the second etching stop layer 18 set in the above-mentioned range, it is possible for these layers to fully display the function as the etching stop layer, and, at the time of removing the etching stop layer, the etching stop layer can be removed uniformly and securely, without generating unevenness of etching.

Figure 4:
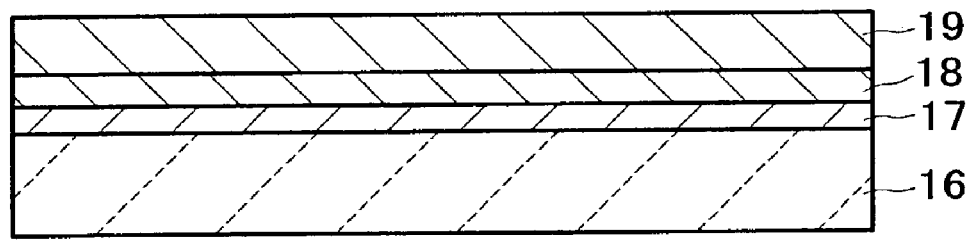
FIG. 4 is a sectional view for illustrating the method of transferring semiconductor devices according to the present invention, showing the condition where a laminate structure for constituting LEDs has been formed on the second etching stop layer.
Figure 5:
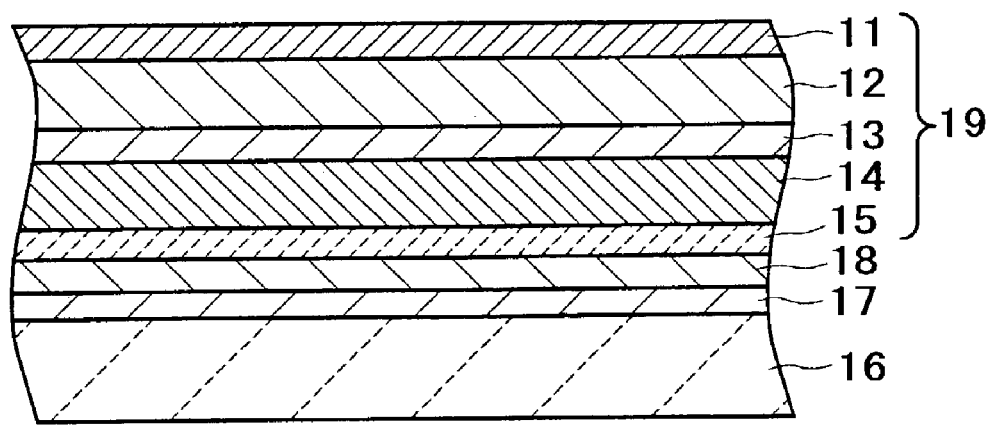
FIG. 5 is a sectional view for illustrating the method of transferring semiconductor devices according to the present invention, showing the condition where an n-type contact layer, an n-type clad layer, an active layer, a p-type clad layer, and a p-type contact layer have been formed on the second etching stop layer.

Next, as shown in FIG. 4, a semiconductor laminate structure (hereinafter referred to simply as laminate structure) 19 for constituting LEDs based on AlGaInP inclusive of contact layers is formed on the second etching stop layer 18. Specifically, as shown in FIG. 5, GaAs as the n-type contact layer 15, AlGaInP as the n-type clad layer 14, AlGaInP as the active layer 13, AlGaInP as the p-type clad layer 12, and GaAs as the p-type contact layer 11 are sequentially grown on the second etching stop layer 18 by, for example, a metallo-organic chemical vapor deposition (MOCVD) method.

Incidentally, GaAs constituting the n-type contact layer 15 absorbs light with a wavelength emitted from the AlGaInP-based device. Therefore, in order to prevent the emission efficiency of the LED device 3 from being lowered, it is preferable to set the film thickness of the n-type contact layer 15 as small as possible; for example, a film thickness of about 1 to 50 nm is preferable.

Figure 6:
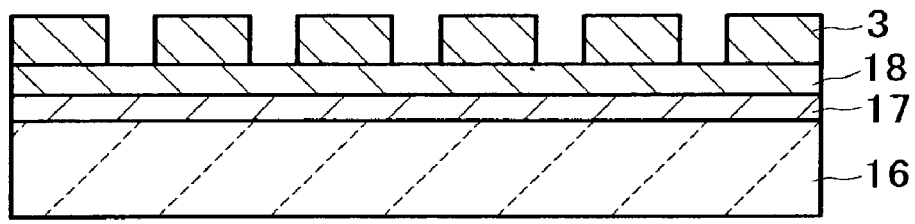
FIG. 6 is a sectional view for illustrating the method of transferring semiconductor devices according to the present invention, showing the condition where the laminate structure formed on the second etching stop layer has been wet-etched from the face side.

Next, as shown in FIG. 6, the laminate structure 19 formed on the second etching layer 18 is subjected to wet etching as device isolation etching on the face side, i.e., on the side opposite to the side of the GaAs substrate 16, to perform LED device isolation.

Figure 7:
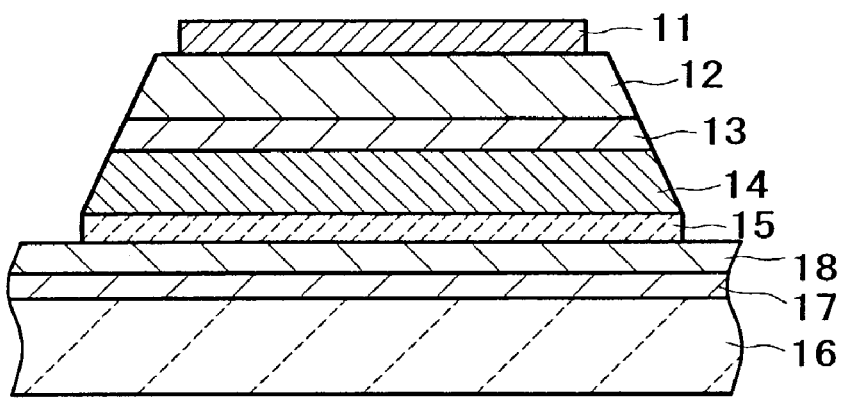
FIG. 7 is an enlarged view of an essential part for illustrating the method of transferring semiconductor devices according to the present invention, showing the enlarged LED device portion of FIG. 6.

To be more specific, first, only the p-type contact layer 11, i.e., only GaAs is selectively etched. Next, selective etching of the p-type clad layer 12, the active layer 13, and the n-type clad layer 14, i.e., selective etching of AlGaInP is conducted. Thereafter, selective etching of the n-type contact layer 15, i.e., selective etching of GaAs is conducted. By conducting these selective etching steps, the laminate structure 19 can be etched as shown in FIG. 7, for example.

Here, since the n-type contact layer 15 is a thin layer, where defects or the like are present in the n-type contact layer 15, the etching solution may permeate through the defects or the like in the n-type contact layer 15 at the time of the selective etching of the p-type clad layer 12, the active layer 13, and the n-type clad layer 14 for device isolation. In addition, where the etching stop layer is composed of only one layer of AlGaInP, the etching stop layer would be etched by the etching solution.

Where such a phenomenon has occurred, at the time of etching from the back side, i.e., the side of the GaAs substrate 16 for removing the GaAs substrate 16, the etching solution would permeate through the etched portions of the etching stop layer to the device side, to erode the device portions such as the n-type contact layer 15 and the active layer, thereby giving damage to the device portions.

In the present invention, however, the etching stop layer has a two-layer structure composed of the etching stop layer 17 and the etching stop layer 18, and the etching stop layer 18 adjacent to the n-type contact layer 15 is formed of AlGaAs, which is a material having a high etching selectivity ratio relative to the p-type clad layer 12, the active layer 13, and the n-type clad layer 14.

With this constitution, even where defects or the like are present in the n-type contact layer 15, the etching stop layer 18 would not be etched by the etching solution at the time of the selective etching of the p-type clad layer 12, the active layer 13, and the n-type clad layer 14. Therefore, even when etching is conducted from the back side, i.e., from the side of the GaAs substrate 16 for removing the GaAs substrate 16, the problem that the etching solution might permeate through the etched portions of the etching stop layer to the device side to erode the device portions or the like problems can be prevented from being generated.

In addition, the selective etching of the n-type contact layer 15 is securely stopped by the etching stop layer 18, since the etching stop layer 18 is formed of AlGaAs which is a material having a high etching selectivity ratio relative to the n-type contact layer 15.

Here, the selective etching of the p-type contact layer 11, i.e., the selective etching of GaAs is conducted by wet etching using, for example, a mixed solution of phosphoric acid, an aqueous hydrogen peroxide solution and water as the etching solution.

Besides, the selective etching of the p-type clad layer 12, the active layer 13, and the n-type clad layer 14, i.e., the selective etching of AlGaInP is conducted by wet etching using, for example, a mixed solution of hydrochloric acid and acetic acid.

The selective etching of the n-type contact layer 15, i.e., the selective etching of GaAs is conducted by wet etching using, for example, a mixed solution of phosphoric acid, an aqueous hydrogen peroxide solution and water as the etching solution. By using such mixed solutions as the etching solution, only the desired layer can be etched with good efficiency and good accuracy in each of the etching steps, and the selective etching can be securely performed.

Figure 8:
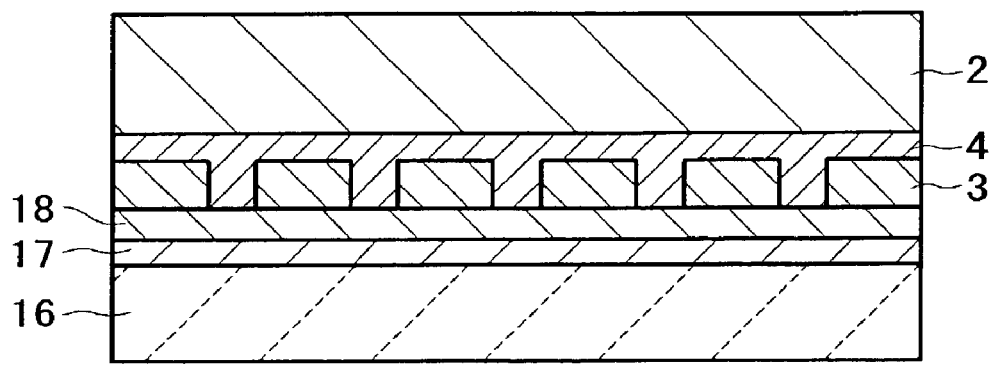
FIG. 8 is a sectional view for illustrating the method of transferring semiconductor devices according to the present invention, showing the condition where the GaAs substrate has been adhered to a transfer substrate so that an adhesive layer and the LED devices face each other.

Next, an adhesive layer 4 is formed on a transfer substrate 2, for example, a sapphire substrate or the like by use of an adhesive, and, as shown in FIG. 8, the GaAs substrate 16 is adhered to the transfer substrate 2 so that the adhesive layer 4 and the isolated LED devices 3 face each other.

Figure 9:
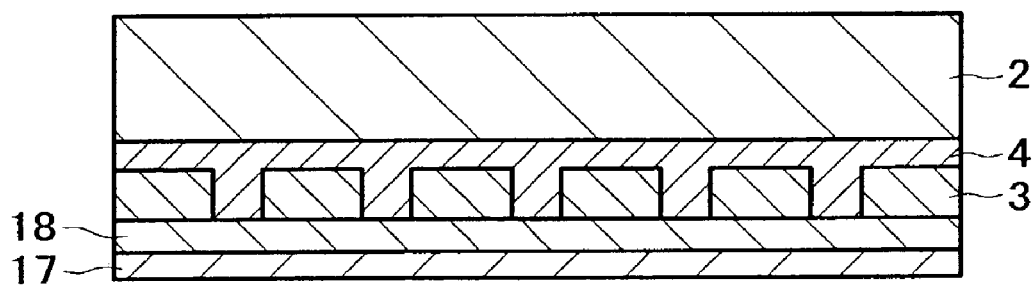
FIG. 9 is a sectional view for illustrating the method of transferring semiconductor devices according to the present invention, showing the condition where the GaAs substrate has been removed by subjecting the GaAs substrate to lapping and wet etching.

Then, the GaAs substrate 16 is subjected to lapping and wet etching from the back side, i.e., from the side opposite to the side of the LED devices 3, to remove the GaAs substrate 16, as shown in FIG. 9. Where the thickness of the GaAs substrate 16 is about 350 μm, for example, a thickness of about 250 μm, for example, is removed by the lapping, and the residual thickness of about 100 μm is removed by the wet etching.

Here, in the conventional method, at the time of removing a thickness of about 100 μm by wet etching in removal of the GaAs substrate, unevenness of etching in plane would be generated, and the period of time for which the assembly is exposed to the etching solution is prolonged. More specifically, the portions where etching of the GaAs substrate has proceeded faster are exposed to the etching solution until completion of the etching of the portions where the GaAs substrate is difficultly removed due to slow progress of etching. As a result, depending on the selection of the etching solution for the GaAs substrate, the n-type contact layer may be partially etched, making it impossible to produce a uniform LED array. In addition, the etching solution for the GaAs substrate may permeate through the interface between the LED device and the adhesive layer, to erode the active layer and/or the p-type contact layer, giving damage to these layers.

In the present invention, however, the etching stop layers 17 and 18 are present between the LED devices 3 and the GaAs substrate 16, so that the etching solution for the GaAs substrate 16 would not penetrate to the side of the LED devices 3 and would not make contact with the LED devices 3 and the adhesive layer 4. As a result, in the present invention, generation of a non-uniform LED devices 3 due to partial etching of the n-type contact layer and the problem that the active layer 13 and/or the p-type contact layer 11 is eroded and damaged due to permeation of the etching solution are prevented from occurring.

In addition, in the present invention, the etching stop layer has a two-layer structure composed of the etching stop layer 17 and the etching stop layer 18, and the etching stop layer 17 adjacent to the GaAs substrate 16 is formed of AlGaInP which is a material having a high etching selectivity ratio relative to the GaAs substrate 16. Therefore, the etching of the GaAs substrate 16 can be securely stopped by the etching stop layer 17, without etching the etching stop layer 17, and only the GaAs substrate 16 can be securely removed by the highly selective etching.

Besides, where the etching stop layer 17 is formed of, for example, AlGaAs, it is difficult to obtain a clean and uniform surface upon the etching of the GaAs substrate 16, due to oxidation of AlGaAs and/or adhesion of reaction products onto the surface of the etching stop layer 17 after completion of the etching of the GaAs substrate 16. Here, if a clean and uniform surface cannot be obtained and a non-uniform surface is obtained upon the etching of the GaAs substrate 16, a non-uniform condition would accordingly be left even in the subsequent steps, and the final LED devices 3 themselves would be non-uniform.

In the present invention, however, since the etching stop layer 17 is composed of AlGaInP, a clean etched finished surface can be easily obtained. More specifically, by composing the etching stop layer 17 of AlGaInP, the problem that reaction products might be deposited on the surface of the etching stop layer 17 upon completion of the etching of the GaAs substrate 16 and the like problems can be obviated, so that a clean and uniform etched finished surface can be obtained upon the etching of the GaAs substrate 16. As a result, bad influences are not exerted on the subsequent steps, and uniform LED devices 3 can be obtained.

In addition, since the etching stop layers 17 and 18 would not be etched in the selective etching of the p-type clad layer 12, the active layer 13, and the n-type clad layer 14, the problem that the etching solution for the GaAs substrate 16 might permeate to the side of the LED devices 3 to produce bad influences on the LED devices 3 is obviated. The etching of the GaAs substrate 16 is conducted by wet etching using, for example, a mixed solution of aqueous ammonia, an aqueous hydrogen peroxide solution and water as the etching solution.

Figure 10:
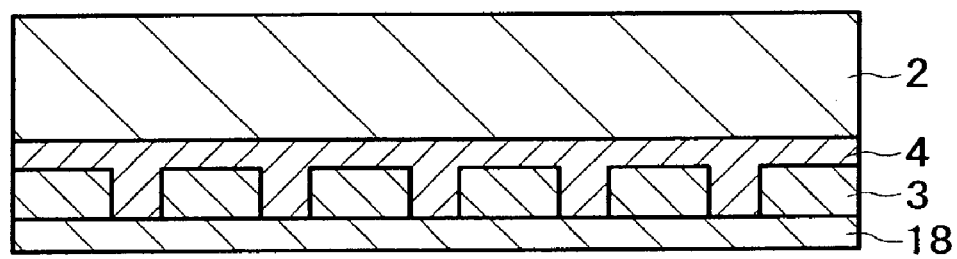
FIG. 10 is a sectional view for illustrating the method of transferring semiconductor devices according to the present invention, showing the condition where the first etching stop layer has been removed by selective etching.

Next, selective etching of only the first etching stop layer 17, i.e., only AlGaInP is conducted from the back side, i.e., from the side opposite to the side of the LED devices 3, to remove the first etching stop layer 17, as shown in FIG. 10. The selective etching of the first etching stop layer 17 is conducted by wet etching using, for example, hydrochloric acid as the etching solution. Here, since the first etching stop layer 17 is composed of a thin film having a thickness of about 0.1 to 2 µm, the first etching stop layer 17 can be removed without generating unevenness of etching in plane, and a uniform and clean etched finished surface can be obtained.

Figure 11:
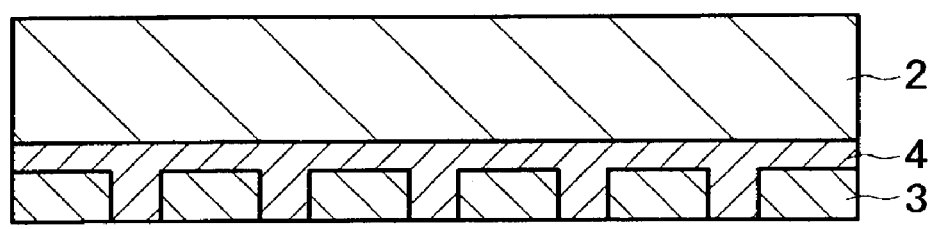
FIG. 11 is a sectional view for illustrating the method of transferring semiconductor devices according to the present invention, showing the condition where the second etching stop layer has been removed by selective etching.

Subsequently, selective etching of only the second etching stop layer 18, i.e., only AlGaAs is conducted from the back side, i.e., from the side opposite to the side of the LED devices 3, to remove the second etching stop layer 18, as shown in FIG. 11. The selective etching of the second etching stop layer 18 is conducted by wet etching using, for example, hydrofluoric acid as the etching solution. Here, since the second etching stop layer 18 is composed of a thin film having a thickness of about 0.1 to 2 µm, the second etching stop layer 18 can be removed without generating unevenness of etching in plane, and a uniform and clean etched finished surface can be obtained.

By the above-described steps, the LED devices 3 formed on the GaAs substrate 16 are isolated from each other, and are transferred onto the transfer substrate 2, whereby the micro LED array 1 can be produced. In the present invention, by using the above-described constitution and operations, all the etching steps both from the face side and from the back side of the GaAs substrate 16 can be made to be perfect selective etching, whereby it is possible to enhance the easiness and reliability of the process and to contrive uniformization of the micro LED array. Besides, by utilizing the present invention, it is possible to easily and securely produce micro LEDs more miniaturized than the conventional ones, and thereby to realize the production of a further miniaturized micro LED array.

While the case where the active layer is formed of AlGaInP has been described as an example in the above description, the present invention is not limited to this. Namely, a structure in which an active layer formed of GaInP is sandwiched between clad layers may be adopted, and, in that case, the effects of the present invention can be obtained in the same manner as above. In addition, the present invention is not limited to the above-described LEDs, and can be applied also to such semiconductor devices as semiconductor laser. While the case of forming the semiconductor devices on the GaAs substrate has been described as an example in the above description, the present invention is not limited to this; for example, the present invention is applicable also to the case where semiconductor devices are formed on a Si substrate.

Figure 12:
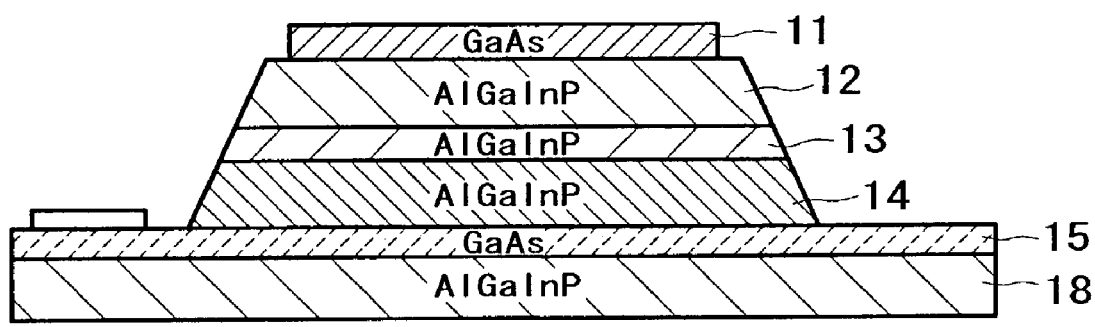
FIG. 12 is a sectional view showing another example of the constitution of the LED device produced by application of the present invention.

In addition, while the LED device 3 from which all the etching stop layers are removed as shown in FIG. 2 has been described in the above description, the present invention is not limited to this structure. For example, where both p-type contact and n-type contact for the LED device 3 are made from the face side, i.e., the side of the p-type contact layer 11, the n-type contact layer 15 may be formed to be wider, thereby providing a contact portion, as shown in FIG. 12. However, the n-type contact layer 15 is very thin and, therefore, very low in mechanical strength, so that the n-type contact layer 15 is liable to be broken by external shock, pressure or the like.

In view of this, the second etching stop layer 18 may be left in substantially the same size as the n-type contact layer 15 so as to function as a layer for supporting the n-type contact layer 15. With such a constitution, it is possible to enhance the mechanical strength of the LED device 3, to obtain such a high strength as to resist breakage by external shock, pressure or the like, and to securely obtain the n-type contact. In this case, the second etching stop layer 18 is required to have a light-transmitting property. By increasing the content of the Al component in AlGaAs, it is possible to make the second etching stop layer 18 substantially transparent, whereby the problem of influencing the function of the LED device 3 can be obviated, and an LED device 3 with good quality can be constituted.

Besides, while the selective etching of the p-type contact layer 11, the p-type clad layer 12, the active layer 13, the n-type clad layer 14, and the n-type contact layer 15 as device isolation etching has been conducted from the face side, i.e., from the side opposite to the side of the GaAs substrate 16 in the above description, the device isolation etching may be conducted from the back side, i.e., from the side of the GaAs substrate 16.

Figure 13:
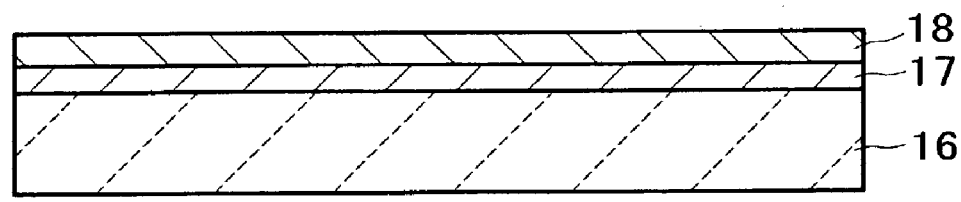
FIG. 13 is a sectional view for illustrating another method of transferring semiconductor devices according to the present invention, showing the condition where a first etching stop layer and a second etching stop layer have been formed on a GaAs substrate.
Figure 14:
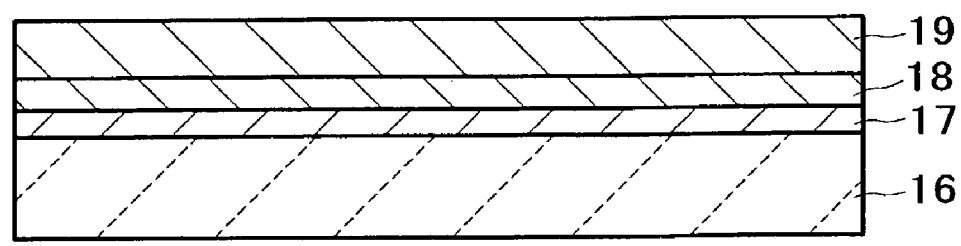
FIG. 14 is a sectional view for illustrating the another method of transferring semiconductor devices according to the present invention, showing the condition where a laminate structure for constituting LEDs has been formed on the second etching stop layer.
Figure 15:
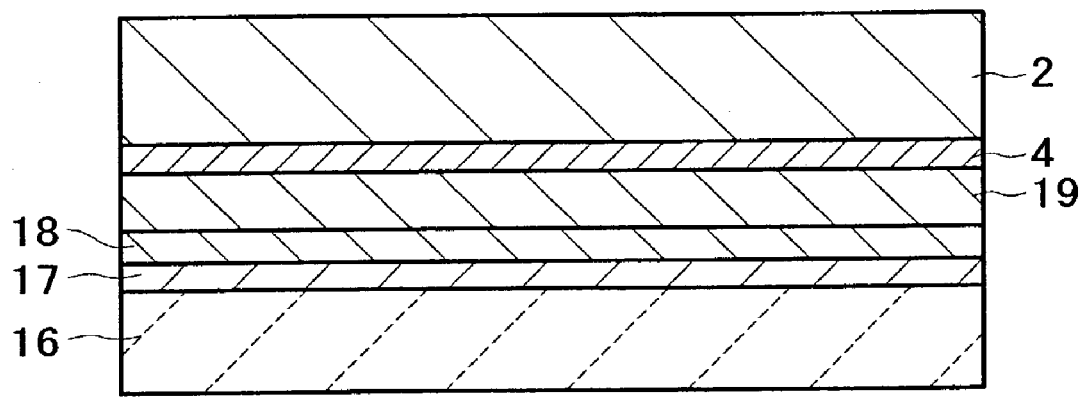
FIG. 15 is a sectional view for illustrating the another method of transferring semiconductor devices according to the present invention, showing the condition where the GaAs substrate has been adhered to a transfer substrate so that an adhesive layer and the laminate structure face each other.
Figure 16:
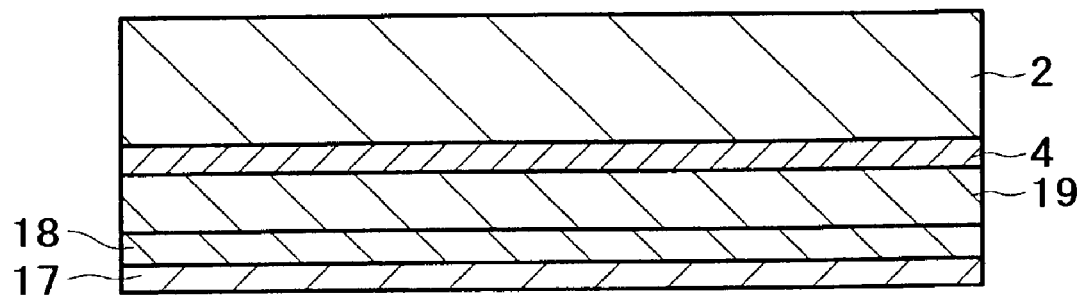
FIG. 16 is a sectional view for illustrating the another method of transferring semiconductor devices according to the present invention, showing the condition where the GaAs substrate has been removed by subjecting the GaAs substrate to lapping and wet etching.
Figure 17:
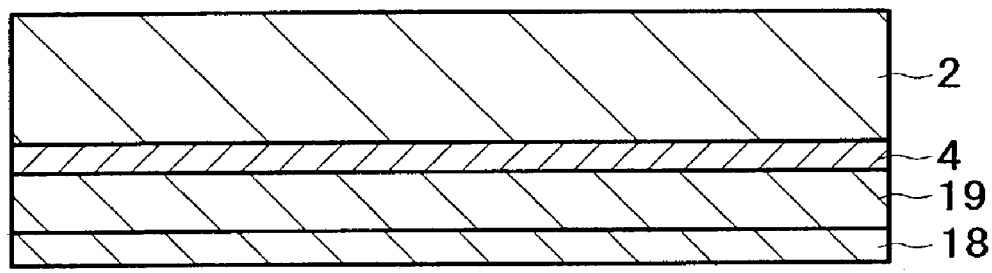
FIG. 17 is a sectional view for illustrating the another method of transferring semiconductor devices according to the present invention, showing the condition where the first etching stop layer has been removed by selective etching.
Figure 18:
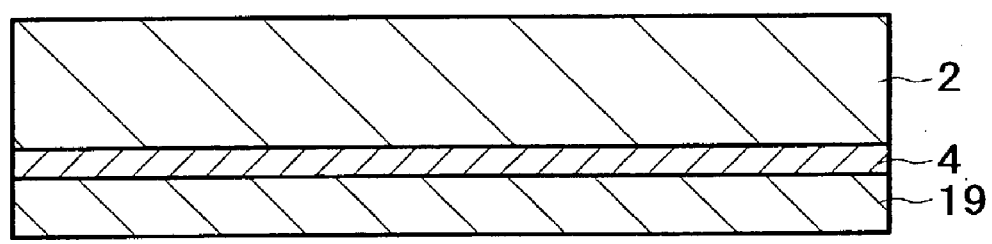
FIG. 18 is a sectional view for illustrating the another method of transferring semiconductor devices according to the present invention, showing the condition where the second etching stop layer has been removed by selective etching.
Figure 19:
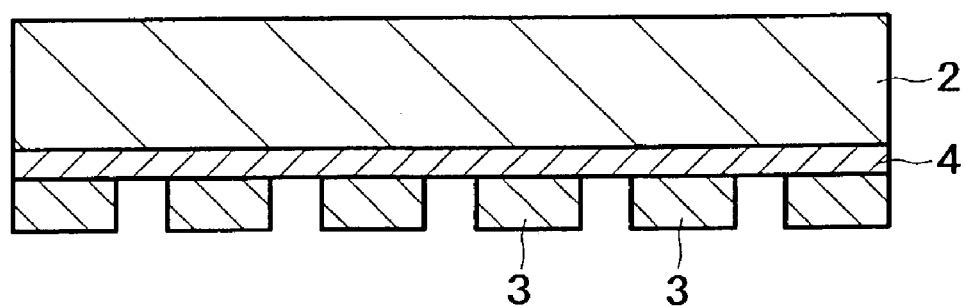
FIG. 19 is a sectional view for illustrating the another method of transferring semiconductor devices according to the present invention, showing the condition where the laminate structure formed on the second etching stop layer has been selectively etched from the back side to isolate the semiconductor devices.
Figure 20:
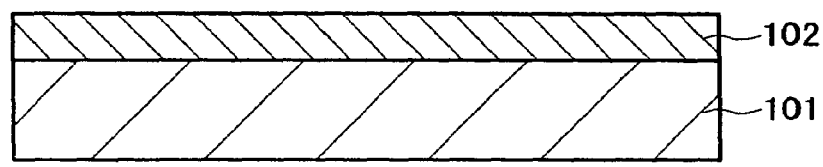
FIG. 20 is a sectional view for illustrating the conventional method of transferring LED devices, showing the condition where a laminate structure for constituting LEDs has been formed on a GaAs substrate.
Figure 21:
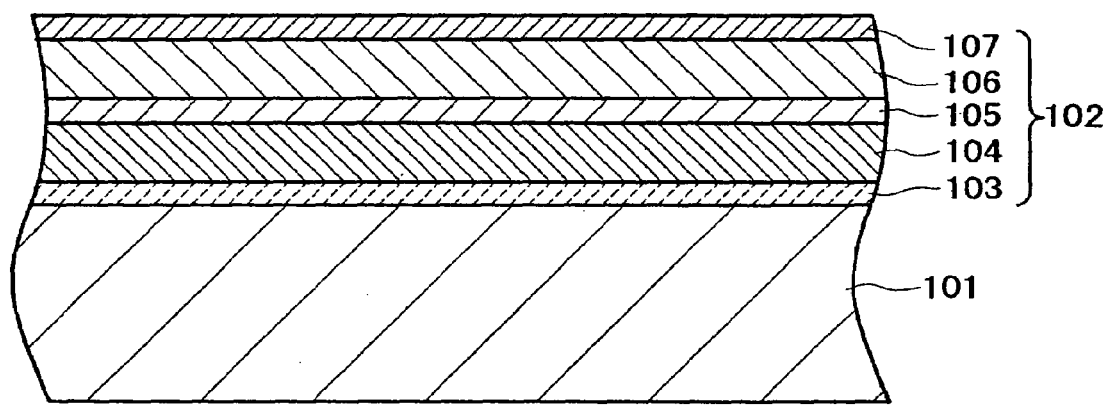
FIG. 21 is a sectional view for illustrating the conventional method of transferring LED devices, showing the condition where an n-type contact layer, an n-type clad layer, an active layer, a p-type clad layer, and a p-type contact layer have been formed on the GaAs substrate.
Figure 22:
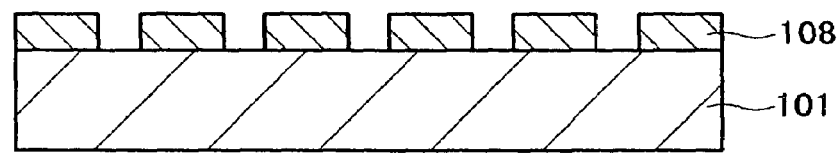
FIG. 22 is a sectional view for illustrating the conventional method of transferring LED devices, showing the condition where the laminate structure formed on the GaAs substrate has been wet-etched from the face side.
Figure 23:
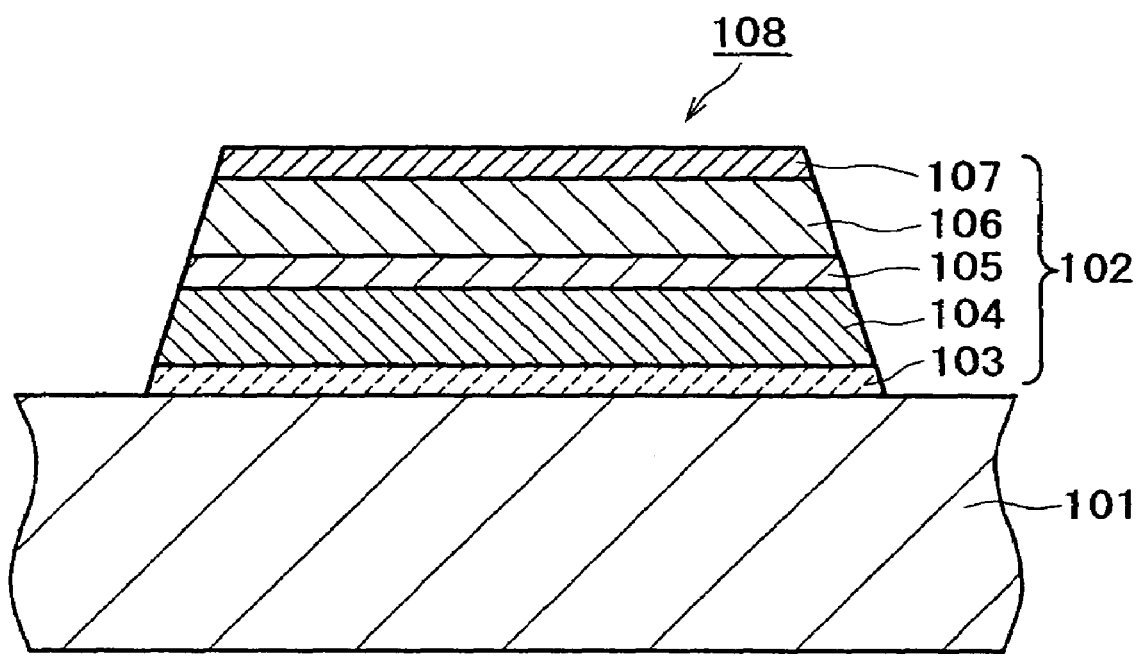
FIG. 23 is an enlarged view of an essential part for illustrating the conventional method of transferring LED devices, showing enlargedly the LED portion of FIG. 22.
Figure 24:
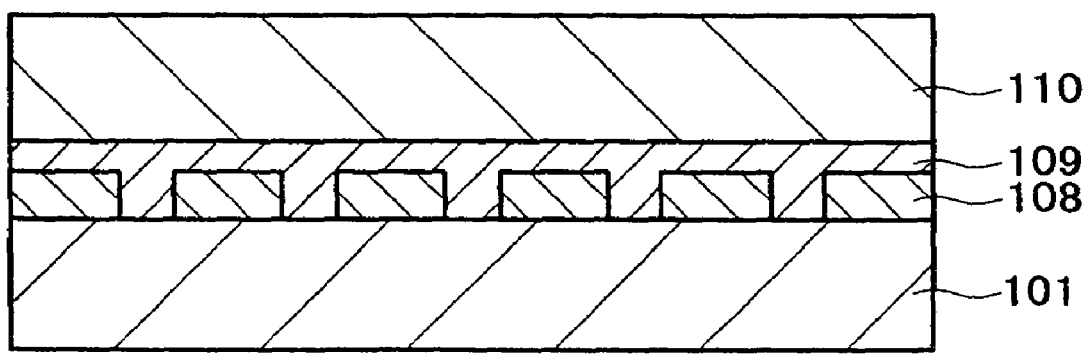
FIG. 24 is a sectional view for illustrating the conventional method of transferring LED devices, showing the condition where the GaAs substrate has been adhered to a transfer substrate so that an adhesive layer and the LED devices face each other.
Figure 25:
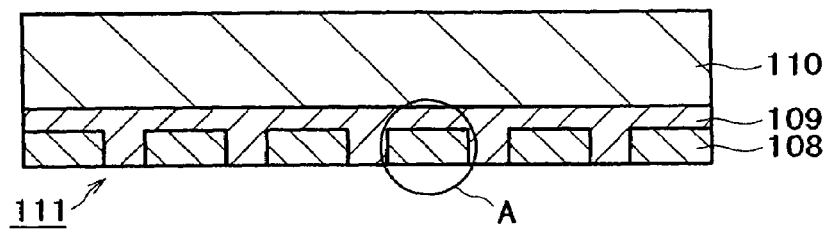
FIG. 25 is a sectional view for illustrating the conventional method of transferring LED devices, showing the condition where the GaAs substrate has been removed by subjecting the GaAs substrate to lapping and wet etching.
Figure 26:
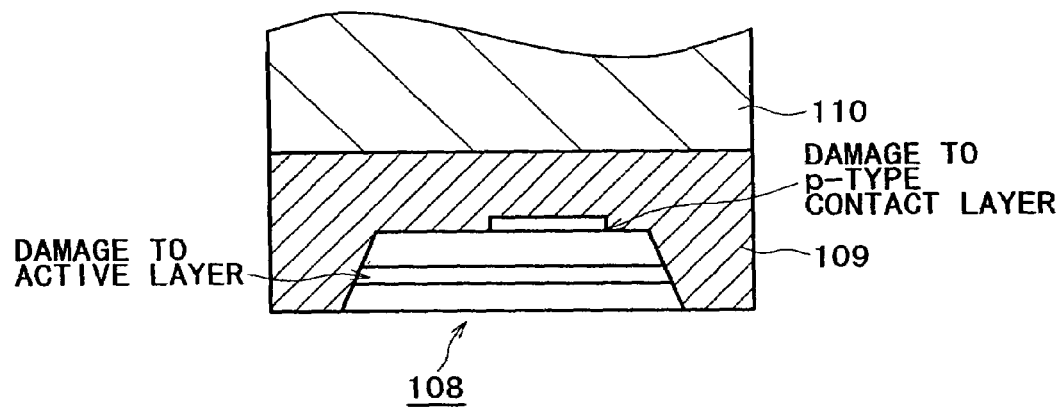
FIG. 26 is an enlarged view of an essential part for illustrating the conventional method of transferring LED devices, showing part A of FIG. 25.
Figure 27:
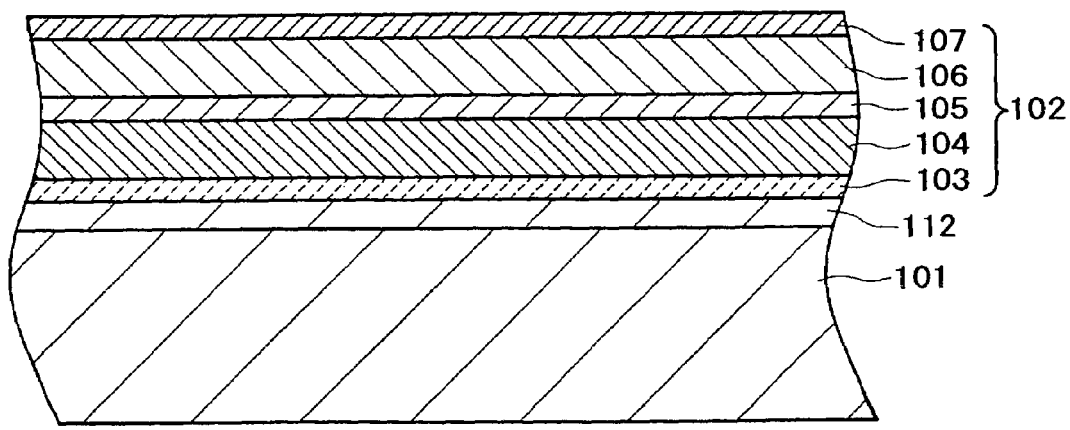
FIG. 27 is a sectional view for illustrating the conventional method of transferring LED devices, showing the condition where an etching stop layer has been formed between the GaAs substrate and the laminate structure.

In this case, the first etching stop layer 17 and the second etching stop layer 18 are formed on the GaAs substrate 16 as shown in FIG. 13 in the same manner as above, and the laminate structure 19 for constituting LEDs is formed on the second etching stop layer 18 as shown in FIG. 14. After the formation of the laminate structure 19, the GaAs substrate 16 is adhered to the transfer substrate 2 provided thereon with the adhesive layer 4 so that the laminate structure 19 and the transfer substrate 2 face each other, as shown in FIG. 15. Then, the GaAs substrate 16 is removed by lapping and wet etching as shown in FIG. 16 in the same manner as above, the first etching stop layer 17 is then etched away as shown in FIG. 17, and the second etching stop layer 18 is etched away as shown in FIG. 18. Thereafter, the laminate structure 19, more specifically, the n-type contact layer 15, the n-type clad layer 14, the active layer 13, the p-type clad layer 12, and the p-type contact layer 11 are removed as shown in FIG. 19, in the order opposite to the above-described order, thereby isolating the devices. By these steps, the laminate structure 19 can be subjected to device isolation, and the LED devices 3 can be transferred onto the transfer substrate 2.

Besides, other than the above-mentioned adhesive as the adhesive layer for adhering the GaAs substrate 16 to the transfer substrate 2, a pressure-sensitive adhesive may be used for the adhesion, and, further, the LED devices 3 and the transfer substrate 2 may be adhered to each other by direct wafer fusion bonding.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

What is claimed is:

1. A method of isolating semiconductor devices by wet etching of a semiconductor laminate structure formed on a substrate, said method comprising the steps of:

providing an etching stop layer having at least two layers between said substrate and said semiconductor laminate structure;

etching said semiconductor laminate structure so as to isolate said semiconductor devices, and thereafter etching away said substrate; and sequentially etching away said etching stop layer wherein said semiconductor laminate structure comprises an n-type contact layer, an n-type clad layer, an active layer, a p-type clad layer, and a p-type contact layer, wherein said p-type clad layer, said active layer and said n-type clad layer are etched by using said n-type contact layer as an etching stop layer at the time of etching said semiconductor laminate structure for isolating said semiconductor devices, and wherein a GaAs substrate is used as said substrate, said etching stop layer on the side of said substrate is formed of AlGaInP, said etching stop layer on the side of said n-type contact layer is formed of AlGaAs, said n-type contact layer and said p-type contact layer are formed of GaAs or GaInP, and said n-type clad layer, said active layer and said p-type clad layer are formed of AlGaInP or GaInP.

2. A method of isolating semiconductor devices as set forth in claim 1, wherein the thickness of said n-type contact layer is in the range of 1 to 50 nm.

3. A method of isolating semiconductor devices as set forth in claim 1, wherein the thickness of said etching stop layer is in the range of 0.1 to 2 μm.

4. A method of isolating semiconductor devices by wet etching of a semiconductor laminate structure formed on a substrate, said method comprising the steps of:

providing an etching stop layer having at least two layers between said substrate and said semiconductor laminate structure; and etching away said substrate, and thereafter sequentially etching away said etching stop layer; and etching said semiconductor laminate structure so as thereby to isolate said semiconductor devices, wherein said semiconductor laminate structure comprises an n-type contact layer, an n-type clad layer, an active layer, a p-type clad layer, and a p-type contact layer, and wherein a GaAs substrate is used as said substrate, said etching stop layer on the side of said substrate is formed of AlGaInP, said etching stop layer on the side of said n-type contact layer is formed of AlGaAs, said n-type contact layer and said p-type contact layer are formed of GaAs or GaInP, and said n-type clad layer, said active layer, and said p-type clad layer are formed of AlGaInP or GaInP.

5. A method of isolating semiconductor devices as set forth in claim 4, wherein the thickness of said n-type contact layer is in the range of 1 to 50 nm.

6. A method of isolating semiconductor devices as set forth in claim 4, wherein the thickness of said etching stop layer is in the range of 0.1 to 2 μm.

7. A method of transferring semiconductor devices by isolating said semiconductor devices through wet etching of a semiconductor laminate structure formed on a substrate, said method comprising the steps of:

providing an etching stop layer having at least two layers between said substrate and said semiconductor laminate structure;

etching said semiconductor laminate structure so as thereby to isolate said semiconductor devices;

adhering said substrate to a transfer substrate with said semiconductor laminate structure therebetween, and thereafter etching away said substrate; and sequentially etching away said etching stop layer, wherein said semiconductor laminate structure comprises an n-type contact layer, an n-type clad layer, an active layer, a p-type clad layer, and a p-type contact layer, and wherein a GaAs substrate is used as said substrate, said etching stop layer on the side of said substrate is formed of AlGaInP, said etching stop layer on the side of said n-type contact layer is formed of AlGaAs, said n-type contact layer and said p-type contact layer are formed of GaAs or GaInP, and said n-type clad layer, said active layer and said p-type clad layer are formed of AlGaInP or GaInP.

8. A method of transferring semiconductor devices as set forth in claim 7, wherein said p-type clad layer, said active layer, and said n-type clad layer are etched by using said n-type contact layer as an etching stop layer at the time of etching said semiconductor laminate structure for isolating said semiconductor devices.

9. A method of transferring semiconductor devices as set forth in claim 7, wherein the thickness of said n-type contact layer is in the range of 1 to 50 nm.

10. A method of transferring semiconductor devices as set forth in claim 7, wherein the thickness of said etching stop layer is in the range of 0.1 to 2 µm.

11. A method of transferring semiconductor devices by isolating said semiconductor devices through wet etching of a semiconductor laminate structure formed on a substrate, said method comprising the steps of:

intermediately providing an etching stop layer comprised of at least two layers between said substrate and said semiconductor laminate structure;

adhering said substrate to a transfer substrate with said semiconductor laminate structure therebetween, etching away said substrate, and thereafter sequentially etching away said etching stop layer; and etching said semiconductor laminate structure so as to isolate said semiconductor devices, wherein said semiconductor laminate structure comprises an n-type contact layer, an n-type clad layer, an active layer, a p-type clad layer, and a p-type contact layer, and wherein a GaAs substrate is used as said substrate, said etching stop layer on the side of said substrate is formed of AlGaInP, said etching stop layer on the side of said n-type contact layer is formed of AlGaAs, said n-type contact layer and said p-type contact layer are formed of GaAs or GaInP, and said n-type clad layer, said active layer and said p-type clad layer are formed of AlGaInP or GaInP.

12. A method of transferring semiconductor devices as set forth in claim 11, wherein the thickness of said n-type contact layer is in the range of 1 to 50 nm.

13. A method of transferring semiconductor devices as set forth in claim 11, wherein the thickness of said etching stop layer is in the range of 0.1 to 2 µm.

* * * * *